(12) United States Patent
Sasaki

(10) Patent No.: US 7,117,913 B2
(45) Date of Patent: Oct. 10, 2006

(54) MOUNTING DEVICE AND METHOD THEREOF

(75) Inventor: Jun Sasaki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 2 days.

(21) Appl. No.: 11/017,653

(22) Filed: Dec. 22, 2004

(65) Prior Publication Data

US 2005/0139307 A1 Jun. 30, 2005

(30) Foreign Application Priority Data

Dec. 24, 2003 (JP) .............................. 2003-427371

(51) Int. Cl.
  *B32B 37/10* (2006.01)
  *B32B 41/00* (2006.01)
(52) U.S. Cl. ...................... 156/358; 156/360; 156/378; 156/379; 156/580; 156/581; 156/582
(58) Field of Classification Search ................ 156/367, 156/368, 378, 379, 580, 581, 582, 358, 360; 29/829, 830, 831, 832, 833, 834, 739, 740
See application file for complete search history.

(56) References Cited

U.S. PATENT DOCUMENTS 5,234,530 A * 8/1993 Freeman, III ................ 156/358
5,985,064 A * 11/1999 Sato .............................. 156/64
2002/0046460 A1* 4/2002 Mimata et al. ................ 29/740
2006/0054283 A1* 3/2006 Yamauchi ..................... 156/580

FOREIGN PATENT DOCUMENTS

JP 7-161770 6/1995
JP 8-153673 6/1996

* cited by examiner

*Primary Examiner*—George Koch
(74) *Attorney, Agent, or Firm*—Whitham, Curtis, Christofferson & Cook, PC

(57) ABSTRACT

A mounting device and a method thereof for preventing a pellet from cracking or chipping when the pellet is mounted. A mounting device comprises a first head for mounting a second pellet on a first pellet already mounted and temporarily pressure-bonding the second pellet thereto by applying a first load and a second head for pressure-bonding the second pellet, which has been temporarily pressure-bonded by the first head, to the first pellet by applying a second load higher than the first load. The second head includes a protective sheet which is moved so that the unused portion is set with respect to each pellet, a ball which is supported rollably in arbitrary directions and in contact with the second pellet through the protective sheet, a spring for applying an elastic force in the direction of the protective sheet and applying the second load to the second pellet through the protective sheet, and a drive for rolling the ball on the protective sheet in contact with the second pellet.

15 Claims, 4 Drawing Sheets

MOUNTING DEVICE AND METHOD THEREOF

BACKGROUND OF THE INVENTION

The present invention relates to a mounting method and a device thereof for a semiconductor device.

DESCRIPTION OF THE PRIOR ART

In the manufacturing process of a semiconductor device, a mounting device has been used for pressure-bonding pellets (also called die), generated from a cut and divided silicon wafer, on a frame. Such conventional mounting devices have been disclosed in Japanese Patent Application laid open No. HEI 8-153673 "Semiconductor manufacture device and its driving method" and Japanese Patent Application laid open No. HEI 7-161770 "Semiconductor element mounting device and method thereof". Incidentally, a pellet to be pressure-bonded may be called "work" in order to be distinguished from the one already mounted on a frame.

FIG. 1 shows the structure of a conventional mounting device. This is a mounting device having one head.

A B pellet 35 cut and divided from a wafer is vacuum-contacted from a ring (not shown) by a suction elastic collet 33 on the top of a mount head (not shown), and pressure-bonded (mounted) to an A pellet 36 already mounted on a substrate 37 of a stacked IC (Integrated Circuit).

Previous to the pressure-bonding, an adhesive sheet 34 is attached to the reverse of the B pellet 35. The place where the B pellet 35 is to be mounted is decided by a recognition camera and a recognition device (not shown). Usually, when the B pellet 35 is mounted, a load of around 100 g is applied thereto immediately after the placement of the B pellet 35 on the A pellet 36.

When using the conventional mounting devices mentioned above, in a stacked semiconductor package, in order to put the B pellet directly on the A pellet, the suction elastic collet has to pick up and hold the B pellet with a designated angle. Otherwise the respective pellets interfere with each other, which causes failures.

Especially, when the pellets are disposed so that they are offset from each other, a corner of one pellet and the surface of the other pellet interfere with each other as shown in FIG. 2, which makes a chip or a crack on the pellets.

Further, the pellet directly attached to the suction elastic collet is put under pressure the moment that it is mounted. Therefore, the pellet is apt to have scratches on its surface.

Such problems arise in the stacked semiconductor package if the pellet has a part which does not overlap another pellet or an under support when mounted. In other words, in the conventional mounting devices, the load is evenly distributed over the surface of the pellet, and affects only the part overlapping with the under support. This causes the pellet to crack or chip. These problems are particularly notable when the pellet is at a tilt.

The conventional mounting devices such as those described in the patent applications mentioned above are not provided with any means to solve the problems, thus allowing the pellet to crack or chip.

SUMMARY OF THE INVENTION

It is therefore an object of the present invention to provide a semiconductor mounting device and a method thereof for preventing a pellet from cracking or chipping when the pellet is mounted.

According to the first aspect of the present invention, to achieve the object mentioned above, there is provided a mounting device comprising a first head for mounting a work on a frame or a pellet already mounted on the frame and temporarily pressure-bonding the work thereto by applying a first load, and a second head for pressure-bonding the work, which has been temporarily pressure-bonded by the first head, to the frame or the pellet by applying a second load higher than the first load. The second head includes: a protective sheet which is moved so that the unused portion is set with respect to each work; a pressure applicator of substantially spherical shape, which is supported rollably in arbitrary directions and in contact with the work through the protective sheet; an elastic member for applying an elastic force to the pressure applicator in the direction of the protective sheet and applying the second load to the work through the protective sheet; and a drive for rolling the pressure applicator on the protective sheet in contact with the work.

According to the second aspect of the present invention, there is provided a mounting device comprising a first head for mounting a work on a frame or a pellet already mounted on the frame and temporarily pressure-bonding the work thereto by applying a first load, and a second head for pressure-bonding the work, which has been temporarily pressure-bonded by the first head, to the frame or the pellet by applying a second load higher than the first load. The second head includes: a protective sheet which is moved so that the unused portion is set with respect to each work; a pressure applicator of substantially column shape, which is supported rollably in designated directions and in contact with the work through the protective sheet; an elastic member for applying an elastic force to the pressure applicator in the direction of the protective sheet and applying the second load to the work through the protective sheet; and a drive for rolling the pressure applicator on the protective sheet in contact with the work.

In the first or second aspect of the present invention, it is desirable that the second head further include: an imaging device for shooting the place where the work is disposed; a sensor for detecting the position on the work in contact with the pressure applicator; and a display for indicating the position on the work in contact with the pressure applicator detected by the sensor on an image shot by the imaging device. In addition, it is desirable that the second head further include a location sensor for detecting the rolling direction and rolling amount of the pressure applicator to indicate the track of the pressure applicator on the display based on the information detected by the location sensor. Furthermore, it is desirable that the second head further include a memory for storing the information on the track of the pressure applicator, and a pressure-bonding section for reading out the information stored in the memory and pressure-bonding the work to the frame or the pellet based on the information.

According to the third aspect of the present invention, there is provided a mounting device comprising a first head for mounting a work on a frame or a pellet already mounted on the frame and temporarily pressure-bonding the work thereto by applying a first load, and a second and a third heads for pressure-bonding the work, which has been temporarily pressure-bonded by the first head, to the frame or the pellet by applying a second load higher than the first load. The second and third heads respectively include: a protective sheet which is moved so that the unused portion is set with respect to each work; a pressure applicator in contact with the work through the protective sheet; an elastic member for applying an elastic force to the pressure applicator in the direction of the protective sheet and applying the second load to the work through the protective sheet; and a drive for rolling the pressure applicator on the protective sheet in contact with the work. The pressure applicator of the second head is of substantially spherical shape and supported rollably in arbitrary directions, while the pressure applicator of the third head is of substantially column shape and supported rollably in designated directions.

In the third aspect of the present invention, it is desirable that each second and third head further include: an imaging device for shooting the place where the work is disposed; a sensor for detecting the position on the work in contact with the pressure applicator; and a display for indicating the position on the work in contact with the pressure applicator detected by the sensor on an image shot by the imaging device. In addition, it is desirable that each of the second and third heads further include a location sensor for detecting the rolling direction and rolling amount of the pressure applicator to indicate the track of the pressure applicator on the display based on the information detected by the location sensor. Furthermore, it is desirable that each of the second and third heads further include a memory for storing the information on the track of the pressure applicator, and a pressure-bonding section for reading out the information stored in the memory and pressure-bonding the work to the frame or the pellet based on the information.

In the structure of any one of the first, second and third aspects of the present invention, it is desirable that the protective sheet be provided between the work and the pressure applicator from reel to reel.

According to the fourth aspect of the present invention, there is provided a mounting method comprising the steps of: temporarily pressure-bonding a work to a frame or a pellet already mounted on the frame by applying a first load; contacting a pressure applicator of substantially spherical shape, which is supported rollably in arbitrary directions, with the work through a protective sheet, which is moved so that the unused portion is set with respect to each work, applying a second load higher than the first load to the work, which has been temporarily pressure-bonded; and rolling the pressure applicator on the protective sheet in contact with the work.

According to the fifth aspect of the present invention, there is provided a mounting method comprising the steps of: temporarily pressure-bonding a work to a frame or a pellet already mounted on the frame by applying a first load; contacting a pressure applicator of substantially column shape, which is supported rollably in arbitrary directions, with the work through a protective sheet, which is moved so that the unused portion is set with respect to each work, applying a second load higher than the first load to the work, which has been temporarily pressure-bonded; and rolling the pressure applicator on the protective sheet in contact with the work.

In the fourth or fifth aspect of the present invention, it is desirable that the mounting method further include the steps of: shooting, by an imaging device, the place where a work is disposed; detecting, by a sensor, the position on the work in contact with a pressure applicator; and indicating the position on the work in contact with the pressure applicator detected by the sensor on an image shot by the imaging device. In addition, it is desirable that the mounting method further include the steps of: detecting, by a location sensor, the rolling direction and rolling amount of the pressure applicator; and indicating the track of the pressure applicator on a display based on the information detected by the location sensor. Furthermore, it is desirable that the mounting method further include the steps of storing the information on the track of the pressure applicator, and pressure-bonding the work to the frame or the pellet based on the information read out of the memory.

In the structure of fourth or fifth aspect of the present invention, it is desirable that the protective sheet be provided between the work and the pressure applicator from reel to reel.

BRIEF DESCRIPTION OF THE DRAWINGS

The above and further objects and novel features of the present invention will be more fully understood from the following detailed description when the same is read in connection with the accompanying drawings in which.

DETAILED DESCRIPTION OF THE PREFERRED EMBODIMENTS

Figure 1:
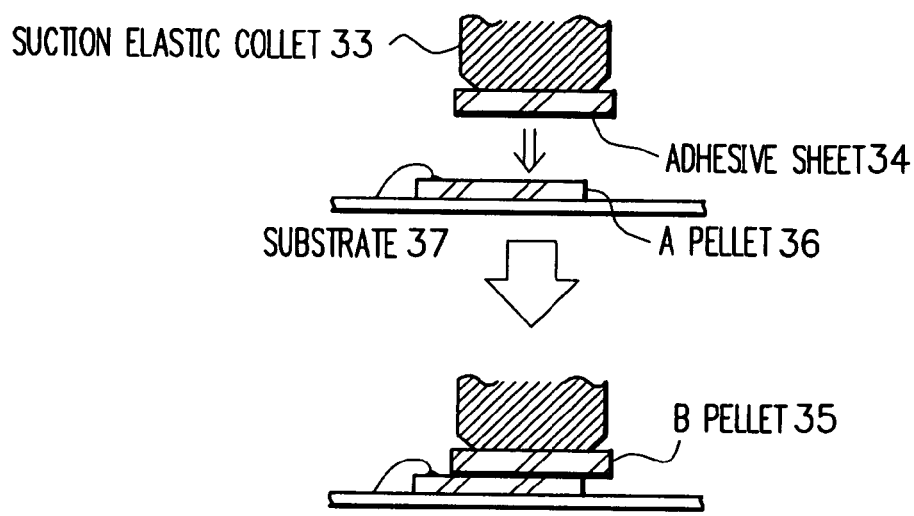
FIG. 1 is a diagram showing a head of conventional mounting device.
Figure 2:
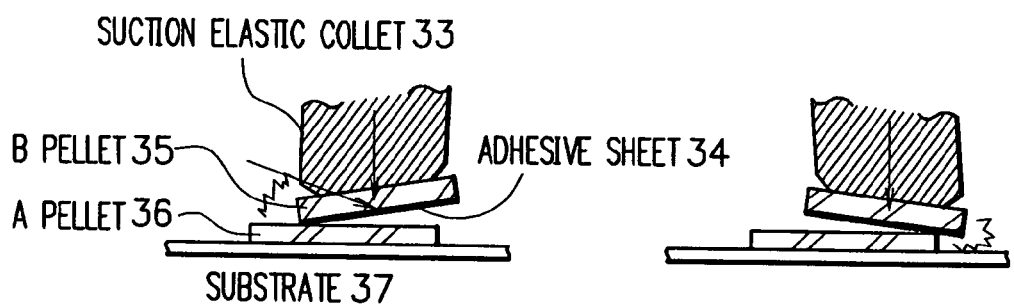
FIG. 2 is a diagram showing the situation where pellets crack or chip when a conventional mounting device is used.

Referring now to the drawings, a description of preferred embodiments of the present invention will be given in detail.

In the following, the first embodiment will be described. A mounting device of the first embodiment comprises two kinds of heads for mounting a pellet. A first head 2 is used for temporary pressure-bonding of a pellet, while a second head 7 is used for proper pressure-bonding of the pellet.

Figure 3:
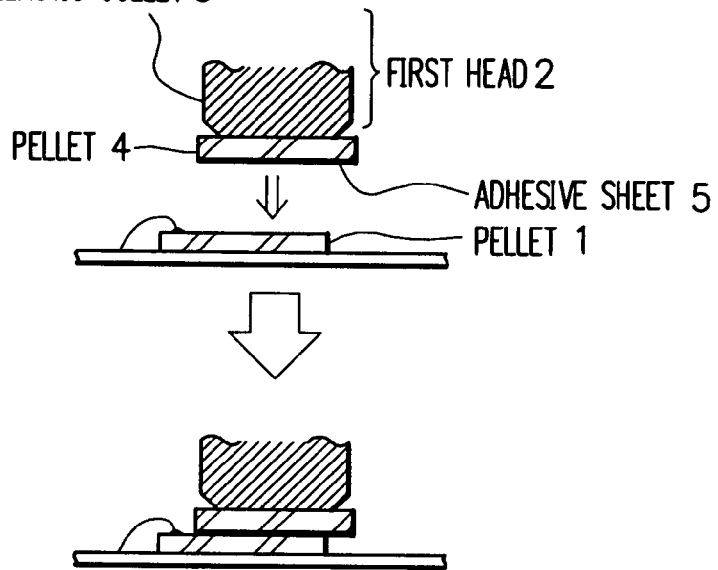
FIG. 3 is a diagram showing the operation for temporary pressure-bonding using a first head of a mounting device according to the first embodiment of the present invention.

FIG. 3 is a diagram showing the first head 2 for temporarily pressure-bonding a pellet according to the first embodiment. Referring to FIG. 3, a description will be given of the operation of the mounting device for temporarily pressure-bonding a pellet with the first head 2. A pellet 4 cut and divided from a wafer is vacum-contacted from a ring (not shown) by a suction elastic collet 3 on the top of the first head 2, and temporarily pressure-bonded to a pellet 1 already mounted on a substrate of a stacked IC.

Here, an adhesive sheet 5 is previously attached to the reverse of the pellet 4. The place where the pellet 4 is to be mounted is decided by a recognition camera and a recognition device (not shown). When pellet 4 is mounted, a load (around 50 g), which does not cause displacement of the pellet 4, is applied thereto immediately after the placement of the pellet 4 on the pellet 1.

After the temporary pressure-bonding of the pellet 4 on the pellet 1 by the first head 2, the second head 7 properly pressure bonds the pellet 4 to the pellet 1.

Figure 4:
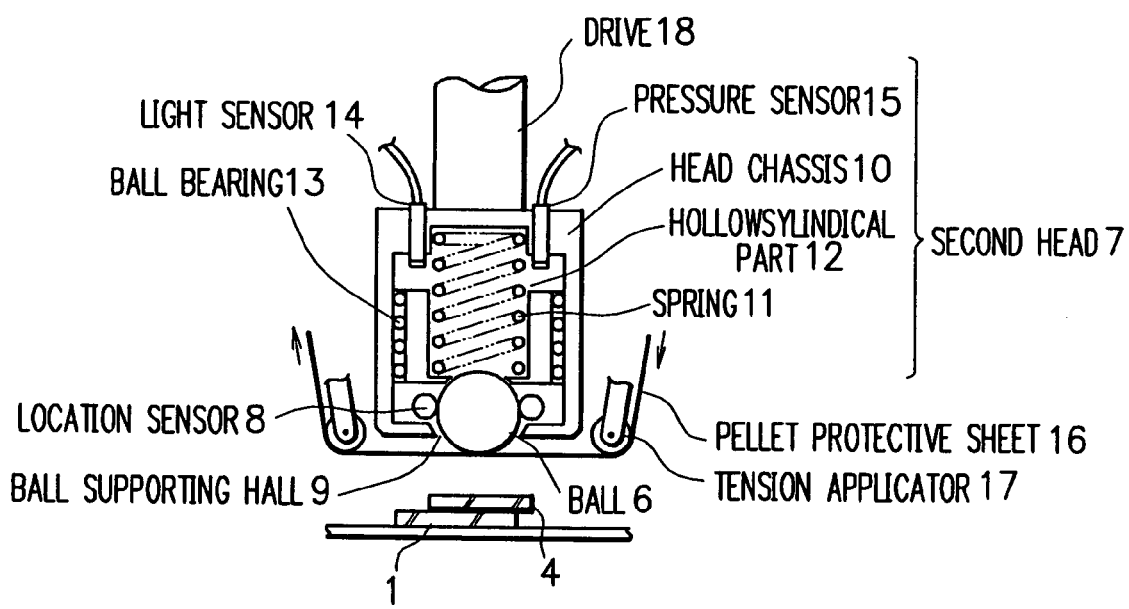
FIG. 4 is a diagram showing the structure of the second head of a mounting device according to the first embodiment of the present invention.

FIG. 4 is a diagram showing the structure of the second head 7. The second head 7 comprises a ball 6, location sensors 8, a spring 11, a hollowcylindical part 12, a ball bearing 13, a light sensor 14, a head chassis 10 having a pressure sensor 15, a pellet protective sheet 16, and tension applicators 17 for applying a designated tension on the protective sheet 16. A drive 18 is equipped with the second head 7 and movable in X, Y and Z directions.

The hollowcylindical part 12 and the ball bearing 13 are pressed to the ball 6 by the spring 11 having a predetermined spring constant, and movable inside the head chassis 10 in vertical directions (directions of expansion and contraction of the spring 11). An arbitrary load can be evenly applied to the ball 6.

The ball 6 protrudes to the outside of the head chassis 10 through a ball supporting hall 9 formed at the bottom of the head chassis 10. Three rollers are placed around the ball 6 in contacting relation thereto so that the ball 6 can roll in arbitrary directions while guided by the ball supporting hall 9 and pressed by the spring 11. The ball 6 never falls from the head chassis 10 because the inside diameter of the ball supporting hall 9 is smaller than the diameter of the ball 6.

Two or three location sensors 8, placed around the ball 6 detect the rolling direction and rolling amount of the ball 6. Based on the output of the location sensor 8, the direction and amount of movement of the second head 7 is calculated.

The light sensor 14 and the pressure sensor 15 are placed above the hollowsylindical part 12. The light sensor detects the distance therefrom to the edge of the hollowsylindical part 12 to measure the relative height at which the ball 6 is set. The pressure sensor 15 detects the amount of pressure applied. Further, below the ball 6, a pellet protective sheet 16, wound on and off by rolls (not shown), stretched parallel to the surface of the pellet by the tension applicator 17. The pellet protective sheet 16 is wound on and off the rolls each time a pellet is pressure-bonded so that the unused portion is winded off.

Figure 5:
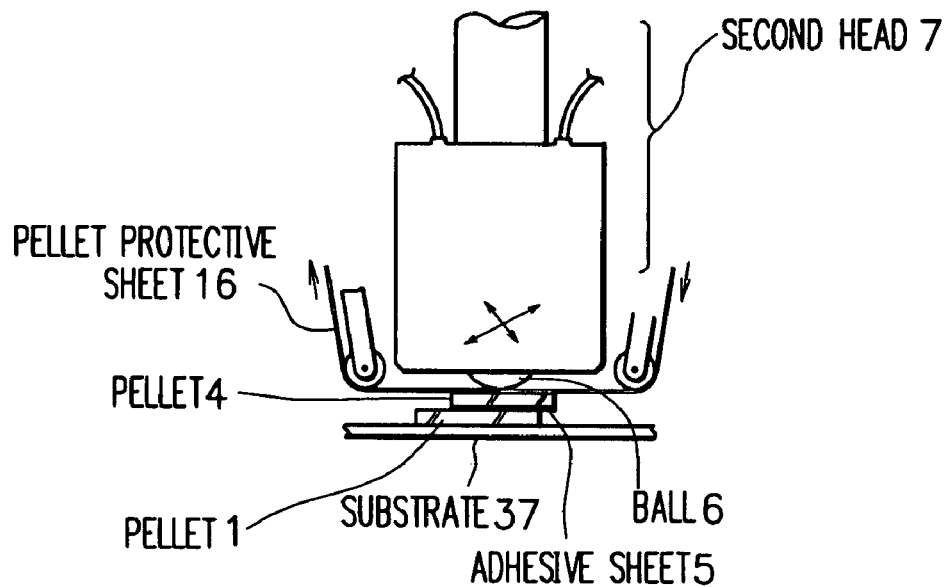
FIG. 5 is a diagram showing the second head touching a pellet according to the first embodiment of the present invention.

Because there is a regular space between the pellet protective sheet 16 and the ball 6, the ball 6 applies no impact force to the pellet 4 when the second head 7 touches the pellet 4. As shown in FIG. 5, when the pellet 4 is press-bonded to the pellet 1, the ball 6 approaches gradually to touch the pellet protective sheet 16, and applies a designated load on the pellet 4.

A description will be given of the operation of the mounting device for mounting the pellet 4 on the pellet 1 already mounted on the substrate 37.

The suction elastic collet 3 of the first head 2 holds the pellet 4 to the reverse of which the adhesive sheet 5 is previously attached. The pellet 4 is moved onto the pellet 1 and subjected to a load of 50 g corresponding to about a half of a conventional mounting load. Thereby, the pellet 4 is temporarily pressure-bonded on the pellet 1.

When the pellet 4 is temporary pressure-bonded, its location is shot by a recognition camera (not shown), and the image is displayed on a recognition device 27.

Next, the second head 7 moves to a designated position and descends onto the pellet 4. At this point, the pellet 4 is contacted by only the pellet protective sheet 16. The ball 6 touching the pellet 4 through the pellet protective sheet 16 is rolled and moved on the pellet protective sheet 16 by the drive 18 which moves the second head 7. In this process, the light sensor 14 and the pressure sensor 15 detect the incline of the pellet 1 (in other words, the pressure-bonding condition of an adhesive paste or an adhesive sheet on the reverse of the pellet 1). Based on the output of these sensors, a load for pressure-bonding the pellet 4 is set, and the pellet 4 is pressure-bonded to the pellet 1. For example, the ball 6 touching the pellet 4 through the pellet protective sheet 16 rolls on the pellet protective sheet 16 while applying a load of around 100 g on the pellet 4. In this process, the load on the pellet 4 is adjusted by feedback control using data detected by the light sensor 14 and the pressure sensor 15.

Additionally, a user may move the ball 6 by controlling the drive 18 manually using an input device (not shown).

Incidentally, because of the pellet protective sheet 16 between the ball 6 and the pellet 4, the rolling movement of the ball 6 causes no scratches on the surface of the pellet 4 while the ball 6 is rolling thereon.

Figure 6:
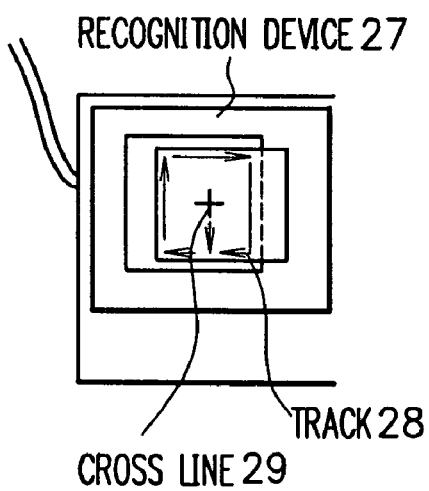
FIG. 6 is a diagram showing an example of the track of the second head.

The rolling direction and rolling amount of the ball 6 is detected by the location sensor 8 and displayed on the recognition device 27. FIG. 6 shows an example of display on the recognition device 27. A cross line 29 indicates the center point of the ball 6. A track 28 shows the movement track of the ball 6. As shown in FIG. 6, the ball 6 rolls only on the part of the pellet 1 which overlaps the pellet 4 (in other word, the part under which a support is placed). Thus, it is possible to prevent the pellets from chipping and cracking. In addition, the ball 6 does not necessarily move in a rectangular path, but it may move spirally, radially, or reciprocate in a line according to the mount condition of the pellets 1 and 4.

Further, the movement track of the ball 6 and a load applied to the pellet 4 may be stored in a memory (not shown) and read out to press-bond other pellets. In this way, it is possible to repeat pressure-bonding of pellets under the same condition.

On completion of proper pressure-bonding, the second head 7 moves upwards and away from the pellet 4. After that, the pellet protective sheet 16 is wound on and off the rolls so that the unused portion is placed between the tension applicators 17.

The mounting device of this embodiment temporarily pressure-bonds pellets with a load about half of a conventional one using the first head, and applies a load only to the part which overlaps an under support using the second head. Thus, it is possible to prevent pellets from chipping and cracking.

Furthermore, because the pellet is shot by the recognition camera and displayed on the recognition device, the amount and direction of movement of the ball are easily checked during pressure-bonding of pellets with the second head.

A description of the second embodiment of the present invention will be given. A mounting device of this embodiment has two heads as with that of the first embodiment.

Figure 7:
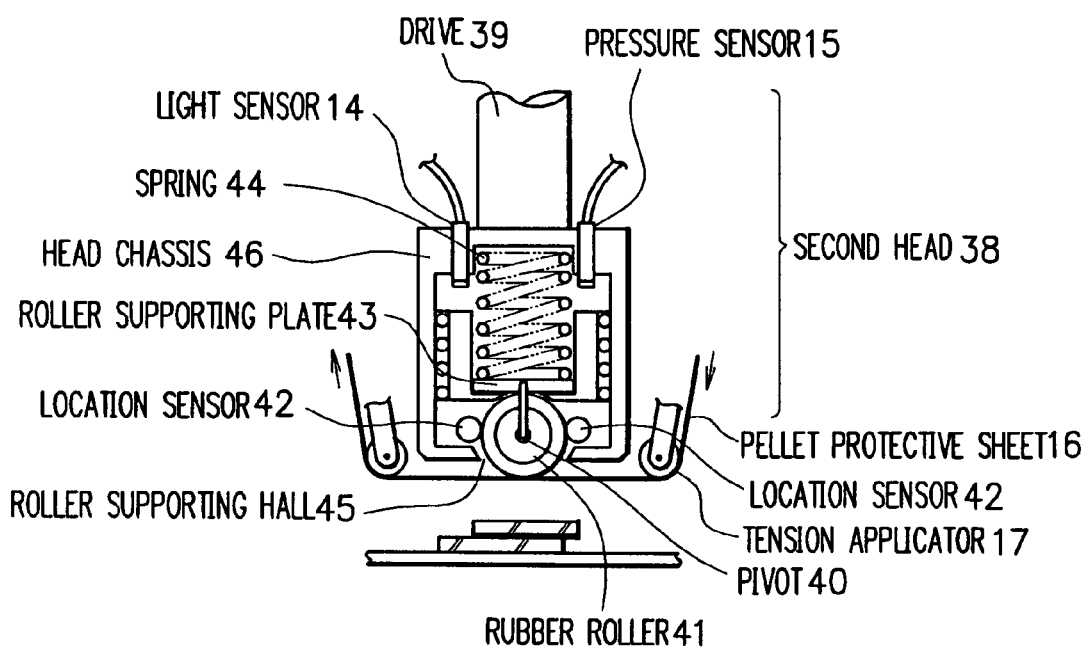
FIG. 7 is a diagram showing the structure of a second head of a mounting device according to the second embodiment of the present invention.

A first head of the mounting device according to the second embodiment is of the same structure as that of the first embodiment. FIG. 7 shows the structure of a second head 38 of the mounting device according to the second embodiment. The second head 38 comprises a rubber roller 41, location sensors 42, a roller supporting plate 43, a spring 44, a head chassis 46 including a light sensor 14 and a pressure sensor 15, a pellet protective sheet 16 and tension applicators 17 for applying a designated tension to the pellet protective sheet 16. The second head 38 is mounted to a drive 39 movable in X, Y and Z directions.

The roller supporting plate 43 is pressed to the rubber roller 41 by the spring 44 having a predetermined spring constant, and movable inside the head chassis 46 in vertical directions (direction of expansion and contraction of the spring 44). An arbitrary load can be evenly applied to the rubber roller 41.

The rubber roller 41 protrudes to the outside of the head chassis 46 through a roller supporting hall 45 formed at the bottom of the head chassis 46. The rubber roller 41 is supported to rollably on a pivot 40, and can roll in arbitrary directions while guided by the roller supporting hall 45 and pressed by the spring 44. The rubber roller 41 never falls from the head chassis 46 because the width of the roller supporting hall 45 is smaller than that of the rubber roller 41.

The rubber roller 41 can be produced by forming engineering plastic into a column shape with the rotary shaft 40 in the center, and fitting an NBR rubber tube around it.

Two location sensors 42, placed along the rolling direction of the rubber roller 41, detecting the rolling direction and rolling amount of the rubber roller 41. Based on the output of the location sensor 42, the direction and amount of movement of the second head 38 are calculated.

The light sensor 14 and the pressure sensor 15 are placed above the roller supporting plate 43. The light sensor 14 measures the relative height at which the rubber roller 41 is set. The pressure sensor 15 detects the amount of pressure applied. Further, below the rubber roller 41, a pellet protective sheet 16 winded on and off rolls (not shown), stretched parallel to the surface of the pellet by the tension applicators 17. The pellet protective sheet 16 is wound on and off the rolls each time a pellet is pressure-bonded so that the unused portion is winded off.

Because there is a regular space between the pellet protective sheet 16 and the rubber roller 41, the rubber roller 41 applies no impact force to the pellet 4 when the second head 38 touches the pellet 4. When the pellet 4 is pressbonded to the pellet 1, the rubber roller 41 approaches gradually to touch the pellet protective sheet 16, and applies a designated load on the pellet 4.

The mounting device of this embodiment, as with that of the first embodiment, only the desired part of the pellet can be pressed. Thus, it is possible to prevent pellets from chipping and cracking.

Furthermore, in the case of producing a semiconductor device, the mounting device of this embodiment requires less time for pressure-bonding of pellets as compared to that of the first embodiment because the rubber roller 41 and the pellet are in line contact. More specifically, in the first embodiment described above, because the ball 6 makes a point contact with the pellet 4 through the pellet protective sheet 16, the ball 6 needs to move spirally or circularly for pressing the pellet 4. On the other hand, in this embodiment, because the rubber roller 41 makes a line contact with the pellet 4 through the pellet protective sheet 16, the same area can be pressed within shorter time. Consequently, throughput can be improved in the semiconductor manufacturing process. Incidentally, the rubber roller 41 which has rolled on the pellet 4, once moves away from the pellet 4, and is repositioned by the drive 39 before touching again the pellet 4 through the pellet protective sheet 16 to presses the pellet 4.

A description of the third embodiment of the present invention will be given. A mounting device of this embodiment comprises the second head 7 of the mounting device of the first embodiment and the second head 38 of the mounting device of the second embodiment.

The mounting device of this embodiment, adopts the second head 38 having the rubber roller 41 making a line contact with the pellet 4 through the pellet protective sheet 16 when pressing the area overlapping one or more under supports in stack structure. On the other hand, the mounting device adopts the second head 7 having the ball 6 making a point contact with the pellet 4 through the pellet protective sheet 16 when pressing the area not overlapping any of under supports or part of under supports in stack structure.

With the second head 7, because it is possible to press the narrow area, mount material can be pressed to have uniform thickness by controlling the amount of load applied and a position where the load is applied.

On the other hand, with the second head 38, because it is possible to press the mount material evenly, the time taken to complete pressure-bonding can be reduced.

As described above, by using two kinds of heads depending on the types of stack structures, it is possible to use the heads effectively for pressure-bonding of pellets.

While, in the embodiments described above, pressure-bonding of two pellets is described as an example, three or more pellets may be stacked.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A mounting device comprising:
    a first head for mounting a work on a frame or a pellet already mounted on the frame and temporarily pressure-bonding the work thereto by applying a first load; and
    a second head for pressure-bonding the work, which has been temporarily pressure-bonded by the first head, to the frame or the pellet by applying a second load higher than the first head, wherein the second head includes:
        a protective sheet, which is moved so that the unused portion is set with respect to each work;
        a pressure applicator of substantially spherical shape, which is supported rollably in arbitrary directions and in contact with the work through the protective sheet;
        an elastic member for applying an elastic force to the pressure applicator in the direction of the protective sheet and applying the second load to the work through the protective sheet; and
        a drive for rolling the pressure applicator on the protective sheet in contact with the work.

2. The mounting device claimed in claim 1, wherein the second head further includes:
    an imaging device for shooting the place where the work is disposed;
    a sensor for detecting the position on the work in contact with the pressure applicator; and
    a display for indicating the position on the work in contact with the pressure applicator detected by the sensor on an image shot by the imaging device.

3. The mounting device claimed in claim 2, wherein the second head further includes a location sensor for detecting the rolling direction and rolling amount of the pressure applicator to indicate the track of the pressure applicator on the display based on the information detected by the location sensor.

4. The mounting device claimed in claim 3, wherein the second head further includes a memory for storing the information on the track of the pressure applicator, and a pressure-bonding section for reading out the information stored in the memory and pressure-bonding the work to the frame or the pellet based on the information.

5. A mounting device claimed in claim 1, wherein the protective sheet is provided between the work and the pressure applicator from reel to reel.

6. A mounting device comprising:
    a first head for mounting a work on a frame or a pellet already mounted and temporarily pressure-bonding the work thereto by applying a first load; and a second head for pressure-bonding the work, which has been temporarily pressure-bonded by the first head, to the frame or the pellet by applying a second load higher than the first head, wherein the second head includes:
- a protective sheet, which is moved so that the unused portion is set with respect to each work;
- a pressure applicator of substantially column shape, which is supported rollably in arbitrary directions and in contact with the work through the protective sheet;
- an elastic member for applying an elastic force to the pressure applicator in the direction of the protective sheet and applying the second load to the work through the protective sheet; and
- a drive for rolling the pressure applicator on the protective sheet in contact with the work.

7. The mounting device claimed in claim 6, wherein the second head further includes:
- an imaging device for shooting the place where the work is disposed;
- a sensor for detecting the position on the work in contact with the pressure applicator; and
- a display for indicating the position on the work in contact with the pressure applicator detected by the sensor on an image shot by the imaging device.

8. The mounting device claimed in claim 7, wherein the second head further includes a location sensor for detecting the rolling direction and rolling amount of the pressure applicator to indicate the track of the pressure applicator on the display based on the information detected by the location sensor.

9. The mounting device claimed in claim 8, wherein the second head further includes a memory for storing the information on the track of the pressure applicator, and a pressure-bonding section for reading out the information stored in the memory and pressure-bonding the work to the frame or the pellet based on the information.

10. A mounting device claimed in claim 6, wherein the protective sheet is provided between the work and the pressure applicator from reel to reel.

11. A mounting device comprising:
- a first head for mounting a work on a frame or a pellet already mounted on the frame and temporarily pressure-bonding the work thereto by applying a first load; and
- second and third heads for pressure-bonding the work, which has been temporarily pressure-bonded by the first head, to the frame or the pellet by applying a second load higher than the first head, wherein each of the second and third head includes:
  - a protective sheet, which is moved so that the unused portion is set with respect to each work;
  - a pressure applicator in contact with the work through the protective sheet;
  - an elastic member for applying an elastic force to the pressure applicator in the direction of the protective sheet and applying the second load to the work through the protective sheet; and
  - a drive for rolling the pressure applicator on the protective sheet in contact with the work;
- the pressure applicator of the second head is of substantially spherical shape and supported in arbitrary directions; and
- the pressure applicator of the third head is of substantially column shape and supported in designated directions.

12. A mounting device claimed in claim 11, wherein each of the second and third heads further includes:
- an imaging device for shooting the place where the work is disposed;
- a sensor for detecting the position on the work in contact with the pressure applicator; and
- a display for indicating the position on the work in contact with the pressure applicator detected by the sensor on an image shot by the imaging device.

13. A mounting device claimed in claim 12, wherein each of the second and third heads further includes a location sensor for detecting the rolling direction and rolling amount of the pressure applicator to indicate the track of the pressure applicator on the display based on the information detected by the location sensor.

14. A mounting device claimed in claim 13, wherein each of the second and third heads further includes a memory for storing the information on the track of the pressure applicator and a pressure-bonding section for reading out the information stored in the memory and pressure-bonding the work to the frame or the pellet based on the information.

15. A mounting device claimed in claim 11, wherein the protective sheet is provided between the work and the pressure applicator from reel to reel.

* * * * *